(12) United States Patent
Fang et al.

(10) Patent No.: US 9,047,171 B2
(45) Date of Patent: Jun. 2, 2015

(54) DIFFERENTIATING CACHE RELIABILITY TO REDUCE MINIMUM ON-DIE VOLTAGE

(71) Applicant: Intel Corporation, Santa Clara, CA (US)

(72) Inventors: Zhen Fang, Portland, OR (US);
Shih-Lien Lu, Portland, OR (US);
Ravishankar Iyer, Portland, OR (US);
Srihari Makineni, Hillsboro, OR (US)

(73) Assignee: Intel Corporation, Santa Clara ( * ) Notice: Subject to any disclaimer, the term of this patent is extended or adjusted under 35 U.S.C. 154(b) by 259 days.

(21) Appl. No.: 13/631,894

(22) Filed: Sep. 29, 2012

(65) Prior Publication Data

US 2014/0095799 A1 Apr. 3, 2014

(51) Int. Cl.
*G06F 12/00* (2006.01)
*G06F 11/00* (2006.01)
*G06F 1/32* (2006.01)
*G11C 5/14* (2006.01)

(52) U.S. Cl.
CPC ............ *G06F 11/004* (2013.01); *G06F 1/3225* (2013.01); *G06F 1/3275* (2013.01); *G06F 1/3296* (2013.01); *G11C 5/14* (2013.01); *Y02B 60/1225* (2013.01); *Y02B 60/1228* (2013.01); *Y02B 60/1285* (2013.01)

(58) Field of Classification Search
CPC ...................................................... G06F 11/073
See application file for complete search history.

(56) References Cited

U.S. PATENT DOCUMENTS

2013/0290793 A1* 10/2013 Booth et al. .................... 714/54

* cited by examiner

*Primary Examiner* — Baboucarr Faal
(74) *Attorney, Agent, or Firm* — Jordan IP Law, LLC

(57) ABSTRACT

Systems and methods may provide for determining whether a memory access request is error-tolerant, and routing the memory access request to a reliable memory region if the memory access request is error-tolerant. Moreover, the memory access request may be routed to an unreliable memory region if the memory access request is error-tolerant. In one example, use of the unreliable memory region enables a reduction in the minimum operating voltage level for a die containing the reliable and unreliable memory regions.

23 Claims, 2 Drawing Sheets

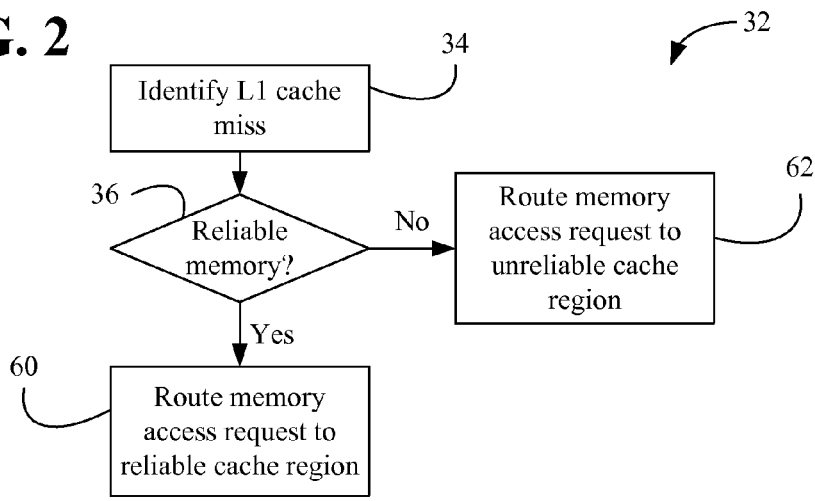
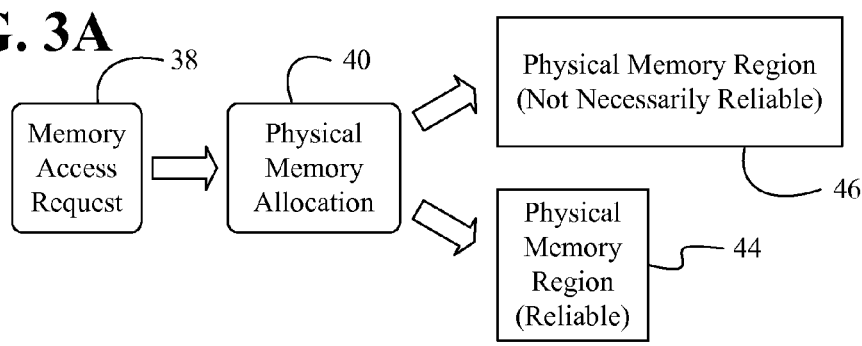
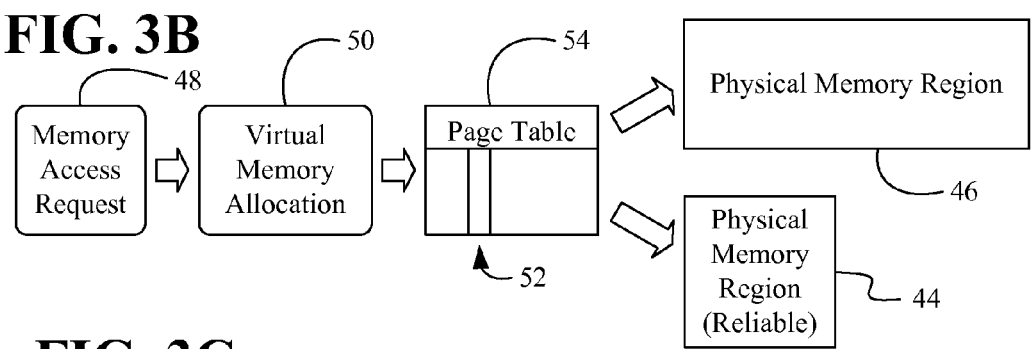
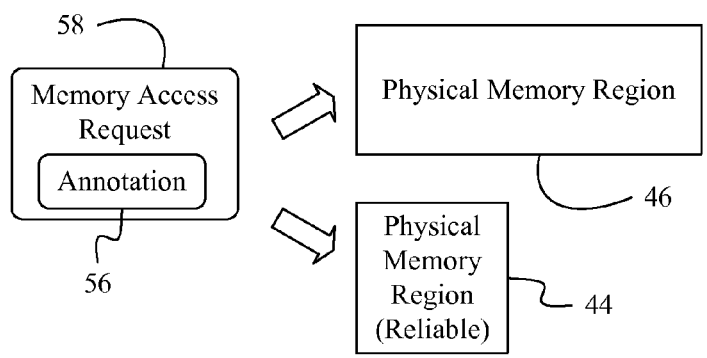

DIFFERENTIATING CACHE RELIABILITY TO REDUCE MINIMUM ON-DIE VOLTAGE

BACKGROUND

1. Technical Field

Embodiments generally relate to processor architectures. More particularly, embodiments relate to differentiating cache reliability to reduce minimum on-die operational voltages in processor architectures.

2. Discussion

As computing platforms become smaller and more lightweight, a number of power management concerns may be encountered. For example, conventional platform processors may have a minimum operational voltage (e.g., $V_{ccMin}$) that is limited by the largest SRAM (static random access memory) array on the processor die, wherein larger SRAM arrays may call for higher minimum operational voltages in order to ensure reliability. Indeed, only a few bits may fail in the larger SRAM arrays, so that a small number of bits may raise the minimum operational voltage of the entire die. High minimum operational voltages can increase power consumption and reduce battery life.

BRIEF DESCRIPTION OF THE DRAWINGS

The various advantages of the embodiments of the present invention will become apparent to one skilled in the art by reading the following specification and appended claims, and by referencing the following drawings, in which:

FIG. 2 is a flowchart of an example of a method of processing cache misses according to an embodiment; and FIGS. 3A-3C are block diagrams of examples of error tolerance determinations according to embodiments.

DETAILED DESCRIPTION

Embodiments may include an apparatus having logic to determine whether a memory access request is error-tolerant. The logic can route the memory access request to a reliable memory region if the memory access request is not error-tolerant, and route the memory access request to an unreliable memory region if the memory access request is error-tolerant.

Embodiments may also include a non-transitory computer readable storage medium having a set of instructions which, if executed by a device, cause the device to determine whether a memory access request is error-tolerant. The instructions, if executed, may also route the memory access request to a reliable memory region if the memory access request is not error-tolerant, and route the memory access request to an unreliable memory region if the memory access request is error-tolerant.

Other embodiments may include a computer implemented method in which a determination is made as to whether a memory access request is error-tolerant. The method can also provide for routing the memory access request to a reliable memory region if the memory access request is not error-tolerant, and routing the memory access request to an unreliable memory region if the memory access request is error-tolerant.

Additionally, embodiments may include a system having a first processor core, a second processor core, a local on-die memory having a reliable memory region and an unreliable memory region, and logic to determine whether a memory access request is error-tolerant. The logic can route the memory access request to the reliable memory region if the memory access request is not error-tolerant, and route the memory access request to the unreliable memory region if the memory access request is error-tolerant. The system may also include a power supply coupled to the first processor core, the second processor core and the local on-die memory.

Figure 1A:
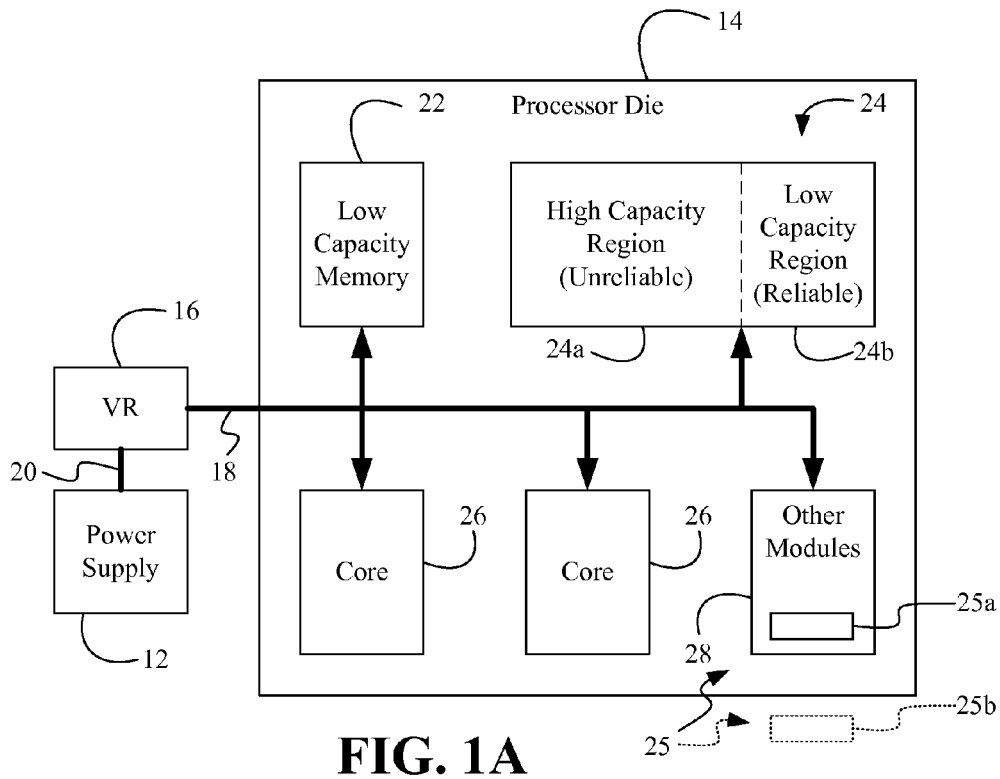
FIG. 1A is a block diagram of an example of a processor die having a reliability differentiated cache architecture according to an embodiment.

Turning now to FIG. 1A, a system 10 is shown. The system 10 may be part of a device having computing functionality (e.g., personal digital assistant/PDA, laptop, smart tablet), communications functionality (e.g., wireless smart phone), imaging functionality, media playing functionality (e.g., smart television/TV), or any combination thereof (e.g., mobile Internet device/MID). In the illustrated example, a power supply 12 (e.g., battery, alternating current/AC adapter) is coupled to a processor die 14 via a voltage regulator (VR) having an output that provides a common operational voltage 18 (e.g., $V_{cc}$) to various modules and/or circuits on the die 14. Thus, the VR 16 may have an input that receives a supply voltage 20 from the power supply 12, wherein the VR 16 is configured to convert the supply voltage 20 to the common operational voltage 18. In one example, the supply voltage 20 is a relatively high direct current (DC) voltage (e.g., 5V) and the common operational voltage 18 is a lower voltage (e.g., 1.5V), with the VR 16 conducting a downconversion.

As will be discussed in greater detail, it may be advantageous to reduce the common operational voltage 18 from a power consumption and battery life standpoint. Indeed, voltage scaling could be used to reduce the common operational voltage 18 depending upon a wide variety of factors such as activity level, temperature, and so forth. There may be a minimum level (e.g., $V_{ccMin}$), however, to which the common operational voltage 18 can be scaled based on the operational needs of the modules on the processor die 14. For example, the illustrated die 14 includes a relatively low capacity memory 22 such as a "level one" (L1) cache, scratchpad memory, etc., a relatively high capacity memory 24 (24a-24b) such as a "level 2" (L2) cache, "level 3" (L3) cache, "last level" cache, scratchpad memory, etc., one or more cores 26, as well as various other modules 28, wherein during operation data and/or instructions used by the cores 26 and other modules 28 may be stored in and retrieved from the memories 22, 24 to improve processing efficiency (e.g., reduce the occurrence of off-die memory accesses). The memories 22, 24 may be implemented as, for example, SRAM arrays that may be accessed relatively quickly. Of particular note is that the illustrated high capacity memory 24 is partitioned into a high capacity region 24a and a low capacity region 24b, wherein the minimum common operational voltage 18 is designed to support a certain level of reliability in the low capacity region 24b but not the high capacity region 24a.

Figure 1B:
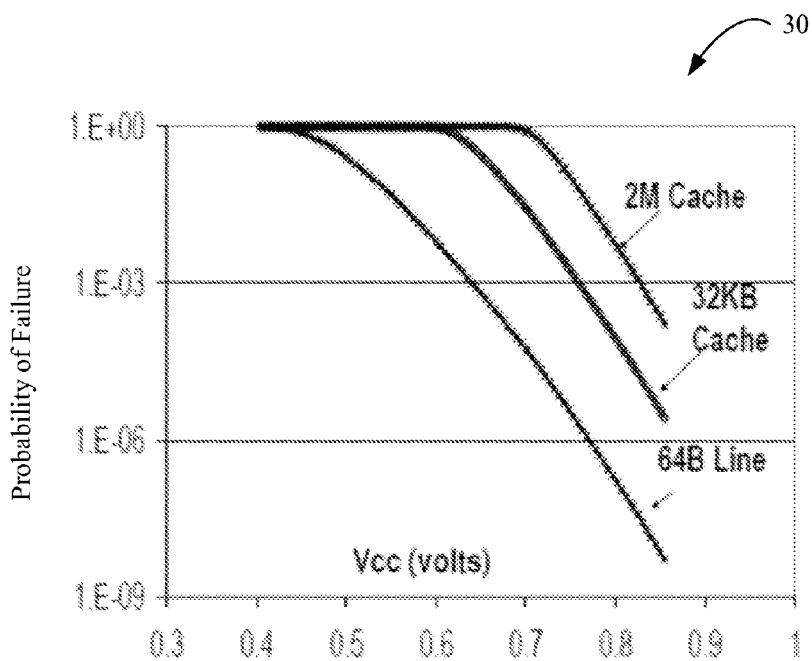
FIG. 1B is a plot of an example of a set of failure probability curves according to an embodiment.

In this regard, FIG. 1B demonstrates in a plot 30 that the probability of a failure occurring in a cache structure may generally increase as cache size (i.e., capacity) is increased. The greater probability of failure in the higher capacity cache structures may be due in part to higher transistor density and tighter transistor voltage threshold tolerances. For example, at an operational voltage of 0.8V, a 32 KB cache would have a failure probability that is less than 1.0E-03, whereas a 2M cache would have a failure probability that is greater than 1.0E-03 for the same operational voltage, in the example shown. Additionally, the probability of a failure occurring in a cache structure may generally decrease as the minimum operational voltage is increased. For example, a 2M cache powered by an operational voltage of 0.75V would have a failure probability that is greater than 1.0E-03, whereas the same 2M cache powered by an operational voltage of 0.85V would have a failure probability that is less than 1.0E-03, in the example shown.

With continuing reference to FIGS. 1A and 1B, the illustrated high capacity memory 24 is powered by minimum operational voltage 18 that is high enough to render the small region 24b reliable but not high enough to render the large region 24a reliable. As will be discussed in greater detail, the system 10 may be configured to use the high capacity region 24a to store data that is error-tolerant, and use the low capacity region 24b to store instructions and data that are not error-tolerant. Logic 25 (25a, 25b) to determine where to route memory access requests may be implemented, for example, in one or more of the cores 26, in the other modules 28, or elsewhere on the die 14, as appropriate. The logic 25 may be implemented in software, hardware, firmware or any combination thereof. For example, the illustrated logic 25a is implemented on the processor die and the illustrated logic 25b is implemented off/outside of the processor die (e.g., 25b).

FIG. 2 shows a method 32 of processing cache misses. The method 32 may be implemented as a set of logic instructions stored in a machine- or computer-readable storage medium such as RAM, read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof. In one example, the method 32 is implemented as the logic 25 (FIG. 1A), already discussed.

Illustrated processing block 34 provides for identifying an L1 cache miss, which may result from a memory access request associated with one or more operations (e.g., read, write, move, etc.) being performed on a processor die such as the die 10 (FIG. 1). The L1 cache miss may therefore correspond to a condition in which instructions and/or data associated with the memory access request are not present in an L1 cache such as, for example, the relatively low capacity cache 22 (FIG. 1).

A determination may be made at block 36 as to whether the memory access request is error-tolerant. In this regard, certain applications such as, for example, signal processing and graphics applications may be insensitive to errors for a number of reasons. For example, noise and errors that are commonly present in signal sources such as cameras, microphones, and sensors may require that the processing modules supporting these devices also be error-tolerant. Moreover, human beings can often be insensitive to the transient, sporadic losses of quality that may be encountered in signal processing and graphics applications. For example, the human eye may be quite insensitive to changes in colors of the objects in a motion picture. Thus, the level of errors that these applications can tolerate may be orders of magnitude higher than the on-die SRAM memory cell failures that might be induced by a very low minimum operational voltage.

All variables, however, may not be error-tolerant. For example, the pseudo code below for an audio speech recognition function (Gaussian Markov Model/GMM scoring function of the Carnegie Mellon University Sphinx3 speech recognition engine) demonstrates that error-tolerant variables and non-error-tolerant variables can be distinguished from one another in any application.

```
For every audio frame X;
    For senone from 0 to 8120;
        For mix from 0 to 16;
            lrd=LRD[mix];
            For dim from 0 to 39;
                lrd=lrd−(X[dim] − Mean[senone][mix][dim])×
                    Variance[senone] [mix][dim];
            gauscr=(f×lrd)+Weight[senone][mix];
        score[senones]=LogAdd(score,gauscr).
```

In particular, the variables with a double underline are error-tolerant and the variables with a single underline are not error-tolerant, in the illustrated example. Of particular note is that the error-tolerant variables (e.g., "Mean", "Variance", etc.) may constitute the vast majority of memory accesses and can dominate the working set of certain applications such as signal processing and graphics applications. The error-sensitive variables (e.g., "senone", "mix", etc.), on the other hand, may be primarily control variables that account for an extremely small portion of the working set. Indeed, such a case is rather representative with respect to signal processing and graphics applications.

The determination as to whether a memory access request is error-tolerant may be conducted in a number of ways. For example, FIG. 3A demonstrates that a memory access request 38 can be used to identify a physical memory allocation 40 (e.g., variable initialization subroutine), which in turn may point to either a smaller (e.g., low capacity) physical memory region 44, such as the reliable low capacity region 24b (FIG. 1), or a larger (e.g., high capacity) physical memory region 46, such as the unreliable high capacity region 24a (FIG. 1). More particularly, the application programmer could use a different memory allocation call (e.g., "malloc_resilient ( )") to request memory for data that is known to not tolerate errors. Thus, unless explicitly allocated through the malloc_resilient ( ) initialization call, all other memory objects could map to the unreliable and larger physical memory region 46. Thus, a page frame manager in the OS (operating system) kernel may allocate page frames from the unreliable and larger physical memory region 46 in a pre-partitioned physical address space, wherein the boundary between reliable and unreliable regions can be adjusted. In accordance with the partitioning of physical address space, the page frame manager might maintain two pools of free physical pages—one for reliable pages and the other for unreliable pages.

FIG. 3B demonstrates another approach in which a memory access request 48 may be used to identify a virtual memory allocation 50, which in turn may enable access to a reliability bit 52 in a page table 54. The reliability bit 52 can therefore point to either the reliable and smaller physical memory region 44 or the unreliable and larger physical memory region 46. Thus, each virtual page is essentially marked with a reliable/unreliable property in the illustrated example, wherein the application programmer may still use the malloc_resilient ( ) call to establish the virtual memory allocation 50. Such a call, however, might not need special page frame allocation due to the reliability bit 52 in the page table 54. For a physically addressed cache, the reliability bit 52 may be carried over to the physical address domain.

FIG. 3C demonstrates yet another approach in which a memory access request 58 is configured to include an instruction annotation 56 that enables the determination to be made as to whether the memory access request 58 is error-tolerant. For example, "mov.reliable" and "mov.unreliable" instructions might be used instead of a generic "mov" instruction. Such an approach can obviate the need to change the OS kernel or page table entry/TLB (translation lookaside buffer) format. On the other hand, the illustrated approach may pose challenges in terms of program complexity, debugging difficulty, and ISA (industry standard architecture) legacy.

Returning now to FIG. 2, if it is determined that the memory access request is not error-tolerant, illustrated block 60 routes the memory access request to the reliable region. If, on the other hand, it is determined that the memory access request is error-tolerant, block 62 may route the memory access request to the unreliable region. As already noted, the unreliable region may have more storage capacity that the reliable region. Moreover, the reliable region may include both instructions and data, whereas the unreliable region can be dedicated to data. Of note is that if the system is not configured to be used for below $V_{ccMin}$ operations, the determination at block 36 may still be performed with L2 cache access being directed to the two regions based on the respective information being stored or retrieved (albeit without the consequent effects of unreliability).

Techniques described herein may therefore reduce both dynamic and leakage power consumption and extend battery life due to a reduced minimum operating voltage. Moreover, depending on the design, ECC (error correction code) logic may be eliminated from the cache. Such an approach can be particularly advantageous in system-on-chip (SoC) and embedded segments due to the prevalence of media, signal processing and graphics applications in those markets.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated. Moreover, any use of the terms "first", "second", etc., does not limit the embodiments discussed to the number of components listed.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A system comprising:
   at least one processor core;
   a local on-die memory including a reliable region and an unreliable region, wherein the reliable region has a failure probability below a given threshold for a set operational voltage and the unreliable region has a failure probability above the given threshold for the set operational voltage;
   logic to,
      determine whether a memory access request is error-tolerant,
      route the memory access request to the reliable region if the memory access request is not error-tolerant, wherein the logic is to identify an instruction annotation in the memory access request to determine whether the memory access request is error-tolerant, or wherein the logic is to identify a physical memory allocation for a variable associated with the memory access request to determine whether the memory access request is error-tolerant or wherein the logic is to identify a virtual memory allocation for a variable associated with the memory access request to determine whether the memory access request is error-tolerant, and
      route the memory access request to the unreliable region if the memory access request is error-tolerant; and a power supply coupled to the at least one processor core and the local on-die memory.

2. The system of claim 1, wherein the logic is to identify a virtual memory allocation for a variable associated with the memory access request to determine whether the memory access request is error-tolerant and wherein the logic is to access a reliability bit in a page table.

3. The system of claim 1, wherein the logic is to determine that the memory access request corresponds to a level one (L1) cache miss.

4. The system of claim 1, further including a voltage regulator having an input coupled to the power supply and an output coupled to the at least one processor core and the local on-die memory.

5. The system of claim 4, further including a die coupled to the at least one processor core and the local on-die memory, wherein the output of the voltage regulator establishes a common operational voltage for the die.

6. The system of claim 1, wherein the unreliable region has more storage capacity than the reliable region.

7. The system of claim 1, wherein the reliable region is to include instructions and data, and the unreliable region is to be dedicated to data.

8. An apparatus comprising:
    logic, implemented in one or more of configurable logic or fixed-functionality logic hardware, to,
        determine whether a memory access request is error-tolerant wherein the logic is to identify a physical memory allocation for a variable associated with the memory access request to determine whether the memory access request is error-tolerant, or wherein the logic is to identify a virtual memory allocation for a variable associated with the memory access request to determine whether the memory access request is error-tolerant, or wherein the logic is to identify an instruction annotation in the memory access request to determine whether the memory access request is error-tolerant,
        route the memory access request to a reliable memory region if the memory access request is not error-tolerant, and
        route the memory access request to an unreliable memory region if the memory access request is error-tolerant, wherein the reliable memory region has a failure probability below a given threshold for a set operational voltage and the unreliable memory region has a failure probability above the given threshold for the set operational voltage.

9. The apparatus of claim 8, wherein the logic is to identify a virtual memory allocation for a variable associated with the memory access request to determine whether the memory access request is error-tolerant and wherein the logic is to access a reliability bit in a page table.

10. The apparatus of claim 8, wherein the logic is to determine that the memory access request corresponds to a level one (L1) cache miss.

11. A non-transitory computer readable storage medium comprising a set of instructions which, if executed by a processor, cause a computer to:
    determine whether a memory access request is error-tolerant wherein the instructions, if executed, cause a computer to identify a physical memory allocation for a variable associated with the memory access request to determine whether the memory access request is error-tolerant, or wherein the instructions, if executed, cause a computer to identify a virtual memory allocation for a variable associated with the memory access request to determine whether the memory access request is error-tolerant, or wherein the instructions, if executed, cause a computer to identify an instruction annotation in the memory access request to determine whether the memory access request is error-tolerant;
    route the memory access request to a reliable memory region if the memory access request is not error-tolerant; and
    route the memory access request to an unreliable memory region if the memory access request is error-tolerant, wherein the reliable memory region has a failure probability below a given threshold for a set operational voltage and the unreliable memory region has a failure probability above the given threshold for the set operational voltage.

12. The medium of claim 11, wherein the instructions, if executed, cause a computer to identify a virtual memory allocation for a variable associated with the memory access request to determine whether the memory access request is error-tolerant and wherein the instructions, if executed, cause a computer to access a reliability bit in a page table.

13. The medium of claim 11, wherein the instructions, if executed, cause a computer to determine that the memory access request corresponds to a level one (L1) cache miss.

14. A computer implemented method comprising:
    determining whether a memory access request is error-tolerant, wherein determining whether the memory access request is error-tolerant includes identifying a physical memory allocation for a variable associated with the memory access request, or wherein determining whether the memory access request is error-tolerant includes identifying a virtual memory allocation for a variable associated with the memory access request, or wherein determining whether the memory access request is error-tolerant includes identifying an instruction annotation in the memory access request;
    routing the memory access request to a reliable memory region if the memory access request is not error-tolerant; and
    routing the memory access request to an unreliable memory region if the memory access request is error-tolerant, wherein the reliable memory region has a failure probability below a given threshold for a set operational voltage and the unreliable memory region has a failure probability above the given threshold for the set operational voltage.

15. The method of claim 14, wherein determining whether the memory access request is error-tolerant includes identifying a virtual memory allocation for a variable associated with the memory access request and wherein identifying the virtual memory allocation includes accessing a reliability bit in a page table.

16. The method of claim 14, further including determining that the memory access request corresponds to a level one (L1) cache miss.

17. A system comprising:
    at least one processor core;
    a local on-die memory including a reliable region and an unreliable region, wherein the reliable region has a failure probability below a given threshold for a set operational voltage and the unreliable region has a failure probability above the given threshold for the set operational voltage; and
    logic to,
        determine whether a memory access request is error-tolerant wherein the logic is to identify a physical memory allocation for a variable associated with the memory access request to determine whether the memory access request is error-tolerant, or wherein the logic is to identify a virtual memory allocation for a variable associated with the memory access request to determine whether the memory access request is error-tolerant, or wherein the logic is to identify an instruction annotation in the memory access request to determine whether the memory access request is error-tolerant,
        route the memory access request to the reliable region if the memory access request is not error-tolerant, and
        route the memory access request to the unreliable region if the memory access request is error-tolerant.

18. The system of claim 17, wherein the logic is to identify a virtual memory allocation for a variable associated with the memory access request to determine whether the memory access request is error-tolerant and wherein the logic is to access a reliability bit in a page table.

19. The system of claim 17, wherein the logic is to determine that the memory access request corresponds to a level one (L1) cache miss.

20. The system of claim 17, further including a voltage regulator having an input coupled to the power supply and an output coupled to the first processor core, the second processor core and the local on-die memory.

21. The system of claim 20, further including a die coupled to the first processor core, the second processor core and the local on-die memory, wherein the output of the voltage regulator establishes a common operational voltage for the die.

22. The system of claim 17, wherein the unreliable region has more storage capacity than the reliable region.

23. The system of claim 17, wherein the reliable region is to include instructions and data, and the unreliable region is to be dedicated to data.

* * * * *